US009091920B2

(12) United States Patent
Sekito et al.

(10) Patent No.: US 9,091,920 B2
(45) Date of Patent: Jul. 28, 2015

(54) PHOTOSENSITIVE SILOXANE RESIN COMPOSITION

(75) Inventors: Takashi Sekito, Kakegawa (JP); Daishi Yokoyama, Kakegawa (JP); Takashi Fuke, Kakegawa (JP); Yuki Tashiro, Kakegawa (JP); Toshiaki Nonaka, Kakegawa (JP); Yasuaki Tanaka, Kakegawa (JP)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 14/117,449

(22) PCT Filed: May 17, 2012

(86) PCT No.: PCT/JP2012/062611
§ 371 (c)(1),
(2), (4) Date: Nov. 13, 2013

(87) PCT Pub. No.: WO2012/157696
PCT Pub. Date: Nov. 22, 2012

(65) Prior Publication Data
US 2014/0335448 A1    Nov. 13, 2014

(30) Foreign Application Priority Data
May 19, 2011    (JP) .................................. 2011-112455

(51) Int. Cl.
*G03F 7/075* (2006.01)
*H01L 21/02* (2006.01)
*H01L 21/311* (2006.01)
*G03F 7/20* (2006.01)

(52) U.S. Cl.
CPC ................ *G03F 7/0757* (2013.01); *G03F 7/20* (2013.01); *H01L 21/02126* (2013.01); *H01L 21/02216* (2013.01); *H01L 21/02282* (2013.01); *H01L 21/311* (2013.01)

(58) Field of Classification Search
CPC ..... G03F 7/057; G03F 7/20; H01L 21/02126; H01L 21/02216; H01L 21/02282; H01L 21/311
USPC ........... 430/271.1, 270.1, 311, 322, 330, 331, 430/272.1, 281.1, 325
See application file for complete search history.

(56) References Cited

U.S. PATENT DOCUMENTS

| 4,138,543 | A | * | 2/1979 | Bargain et al. .................. 528/14 |
| 5,236,984 | A | * | 8/1993 | Yamamoto et al. ........... 524/233 |
| 6,399,733 | B1 | * | 6/2002 | Yamamoto et al. ............. 528/12 |
| 6,440,569 | B1 | * | 8/2002 | Kanamori et al. ............. 428/429 |
| 6,949,324 | B2 | | 9/2005 | Watanabe et al. |
| 2002/0015917 | A1 | | 2/2002 | Lee et al. |
| 2005/0244745 | A1 | * | 11/2005 | Cameron et al. ........... 430/270.1 |
| 2007/0218402 | A1 | * | 9/2007 | Kinsho et al. ............... 430/270.1 |
| 2010/0086872 | A1 | * | 4/2010 | Ogihara et al. ............. 430/272.1 |
| 2011/0008589 | A1 | * | 1/2011 | Kimura et al. .............. 428/195.1 |
| 2011/0008730 | A1 | * | 1/2011 | Hanamura et al. ......... 430/270.1 |
| 2011/0071255 | A1 | * | 3/2011 | Ooike et al. .................. 524/588 |
| 2012/0021190 | A1 | * | 1/2012 | Aoki et al. ................. 428/195.1 |
| 2013/0216952 | A1 | * | 8/2013 | Yokoyama et al. ......... 430/286.1 |
| 2014/0024758 | A1 | * | 1/2014 | Sekito et al. .................. 524/317 |

FOREIGN PATENT DOCUMENTS

| JP | 3-166229 A | | 7/1991 |
| JP | 8-190193 A | | 7/1996 |
| JP | 8-334901 A | | 12/1996 |
| JP | 2000-191656 A | | 7/2000 |
| JP | 2003-255546 A | | 9/2003 |
| JP | 2006-178436 A | | 7/2006 |
| JP | 2006182650 A | * | 7/2006 |
| JP | 2008-208200 A | | 9/2006 |
| JP | 2007-193318 A | | 8/2007 |

OTHER PUBLICATIONS

Machine Translation of JP 2006-182650 (no date).*
Machine Language English Abstract from JPO JP 3-1667229 A.

* cited by examiner

*Primary Examiner* — Amanda C Walke
(74) *Attorney, Agent, or Firm* — Sangya Jain

(57) ABSTRACT

[Object]
To provide a photosensitive siloxane resin composition excellent in alkali-solubility and in sensitivity, and also to provide a pattern-formation method employing that.
[Means]
The present invention provides a photosensitive siloxane resin composition comprising: a siloxane resin having silanol groups or alkoxysilyl groups, a crown ether, a photosensitive material, and an organic solvent. This photosensitive composition is cast on a substrate, subjected to imagewise exposure, treated with an alkali aqueous solution, and cured to form a pattern.

11 Claims, No Drawings

PHOTOSENSITIVE SILOXANE RESIN COMPOSITION

This application is a United States National Stage Patent Application under 35 U.S.C. §371 of International Patent Application No. PCT/JP2012/062611, filed May 17, 2012, which claims priority to Japanese Patent Application No. 2011-112455, filed May 19, 2011, the contents of both documents being hereby incorporated herein by reference.

TECHNICAL FIELD

The present invention relates to a photosensitive composition comprising a siloxane resin alkali-solubilized by silanol groups or alkoxysilyl groups.

BACKGROUND ART

Siloxane resins are known to be materials of high heat resistance, of high hardness, of high insulation and of high transparency, and hence are used for various applications. As one of those applications, a siloxane resin-containing composition is cured to form a hardened coating, which has high durability, low dielectricity, high insulativity and high hardness. By making good use of those properties, the hardened coating is employed as an insulating film, a planarization film or a protective film in a semiconductor device or in a liquid crystal display. Further, it can be also adopted as a semiconductor sealant.

Siloxane resins are produced by hydrolysis of alkoxysilane or halosilane compounds, and hence contain silanol groups therein. The silanol groups contribute to alkali-solubility, and this property of silanol groups is made good use of in various reported photosensitive siloxane resin compositions that can be developed with a developer normally adopted in the field of electronic materials, in particular, with a 2.38% aqueous solution of tetramethylammonium (Patent document 1).

For the purpose of alkali-solubilizing a siloxane resin, it is generally thought to increase the content of silanol groups, namely, to reduce the molecular weight of the resin. However, if the molecular weight is reduced, the resin tends to deteriorate in resistance to thermal reflow processing. Specifically, when the composition is cured to form a film at 200° C. or more, pattern collapse is liable to occur. On the other hand, however, if the resin has too large a molecular weight, the sensitivity can be so lowered that it takes long time to perform exposure and/or development. Further, it is also feared that residues (hereinafter, often referred to as "scum") can be left after development in the area where the composition must be dissolved away with a developer.

In order to improve the resistance to thermal reflow processing while keeping the alkali-solubility, it is studied to use a siloxane resin having a molecular weight low enough to be alkali-soluble in combination with a high molecular weight alkali-insoluble resin. The more those two resins have different molecular weights, the more the resistance to thermal reflow processing is enhanced (Patent document 2). However, the present inventors have found that there still remains a problem of increasing scum remarkably. There are also other proposed methods, such as, addition of a hardening agent (Patent document 3) and incorporation of silica ($SiO_2$) units into the resin (Patent document 4), but they also have room for improvement. Specifically, the method of Patent document 3 tends to increase scum, to lower the temporal stability and to impair the sensitivity. Further, if the polymer contains the silica units in an amount of more than 30 mol %, the method of Patent document 4 tends to increase scum and to lower the temporal stability remarkably.

As a means for solving the above problems, it is often to use multifunctional polysiloxane having neither alkoxy groups nor hydroxyl groups. However, this polysiloxane has disadvantageous properties, such as, low hardenability and poor transparency (Patent document 5).

PRIOR ART DOCUMENTS

Patent Documents

[Patent document 1] Japanese Patent Laid-Open No. 2006-178436
[Patent document 2] Japanese Patent Laid-Open No. 2007-193318
[Patent document 3] Japanese Patent Laid-Open No. 2008-208200
[Patent document 4] Japanese Patent Laid-Open No. 2003-255546
[Patent document 5] Japanese Patent Laid-Open No. 8(1996)-334901

DISCLOSURE OF INVENTION

Problem to be Solved by the Invention

It is an object of the present invention to provide a photosensitive composition free from the above problem. Specifically, the present invention aims to provide a photosensitive composition which comprises an alkali-soluble siloxane resin, which keeps good storage stability, which enables to reduce scum, which is improved in resistance to thermal reflow processing and which has enhanced sensitivity.

Means for Solving Problem

The present invention resides in a photosensitive siloxane resin composition comprising
a siloxane resin having silanol groups or alkoxysilyl groups,
a crown ether,
a photosensitive material, and
an organic solvent.

The present invention also resides in a pattern formation method comprising the steps of:
coating a substrate with the above photosensitive siloxane resin composition, to form a coating;
subjecting said coating to imagewise exposure; treating the exposed coating with an alkali aqueous solution; and then curing the treated coating at 150 to 450° C. in air or in an inert gas atmosphere.

The present invention further resides in a siliceous film produced according the above method.

Effect of the Invention

The photosensitive siloxane resin composition according to the present invention is remarkably improved in alkali-solubility, and is also excellent in temporal stability and in sensitivity. Further, since the crown ether contained therein hardly remains in the coating after cured, the composition enables to form a siliceous film of high transparency. In addition, the siliceous film can realize high insulation, low dielectricity and high heat resistance.

BEST MODE FOR CARRYING OUT THE INVENTION

The following is detailed explanation of the silanol group-containing alkali-soluble siloxane resin of the present invention.

Photosensitive Siloxane Resin Composition

The photosensitive siloxane resin composition of the present invention comprises: (a) a siloxane resin having silanol groups or alkoxysilyl groups, (b) a crown ether, (c) a photosensitive material, (d) an organic solvent, and (e) optional additives.

(a) Siloxane Resin having Silanol Groups or Alkoxysilyl Groups

The siloxane resin adopted in the present invention has silanol groups or alkoxysilyl groups as functional groups. In the present invention, the terms "silanol groups" and "alkoxysilyl groups" mean hydroxyl groups and alkoxy groups, respectively, which directly connect to silicon atoms constituting the siloxane skeleton. Those groups make the siloxane resin alkali-soluble, and hence they enable to treat the resin easily with an alkali developer when the resin is used as a component of the photosensitive composition. Further, those functional groups also serve as reactive groups when the photosensitive composition undergoes a hardening reaction.

The siloxane resin used in the present invention has no particular restrictions on its structure as long as containing silanol and/or alkoxysilyl groups. According to the number of oxygen atoms connecting to silicon atoms, the structure of siloxane resin can be generally categorized into the following three skeletons, that is: silicone skeleton (in which two oxygen atoms connect to each silicon atom), silsesquioxane skeleton (in which three oxygen atoms connect to each silicon atom), and silica skeleton (in which four oxygen atoms connect to each silicon atom). In the present invention, the siloxane resin can have any of those skeletons. Further, the structure of the siloxane resin can be a combination of two or more of them. Furthermore, the siloxane resin used in the present invention can be a mixture of resins having those structures. However, if containing the silicone structure too much, the resin tends to break easily at a high temperature. Accordingly, the amount of the silicone structure is preferably 10 mol % or less based on the whole siloxane resin. It is particularly preferred for the resin to have the silsesquioxane structure or a mixture of the silsesquioxane structure and the silica structure. That is because the hardening reaction tends to proceed rapidly in film-formation and also because the composition has such favorable treatability as to be less sticky when spreading out. If the silica structure is contained too much, the composition has such low stability that the viscosity can increase. Accordingly, the amount of the silica structure is preferably 20 mol % or less, further preferably 10 mol % or less, based on the whole siloxane resin.

The siloxane resin employed in the present invention has silanol groups or alkoxysilyl groups. As described above, those groups are presumed to contribute toward the alkali-solubility of the resin and toward the hardening reaction, and also to have an effect on the storage stability. Even if containing those groups in a very small amount, the siloxane resin can bring the effect of the present invention. However, the favorable number of the groups is considered to depend on the molecular weight of the siloxane resin. Accordingly, in order to contain a favorable number of silanol groups or alkoxysilyl groups, the siloxane resin preferably has a molecular weight in the range described later.

The siloxane resin can have reactive groups other than the silanol or alkoxysilyl groups, such as, carboxyl groups, sulfonyl groups, and amino groups, unless they impair the effect of the present invention. However, since those reactive groups generally tend to lower the storage stability of the photosensitive composition, they are preferably contained in a small amount. Specifically, the amount thereof is preferably 10 mol % or less based on the total number of hydrogen atoms or substituent groups connecting to silicon atoms. Further, it is particularly preferred for the resin not to contain those reactive groups at all. Here, the above "substituent groups" means substituent groups that do not contain Si—O bonds constituting the siloxane structure. Examples thereof include alkyl groups, alkenyl groups, allyl groups, and hydroxyalkyl groups.

A typical example of the siloxane resin usable in the present invention can be obtained, for example, by hydrolysis of one or more alkoxysilane compounds represented by the following formula (A) in an organic solvent.

$$(R^1)_a Si(OR^2)_{4-a} \qquad (A)$$

In the above formula, $R^1$ is hydrogen atom, a substituted or unsubstituted alkyl group having 1 to 6 carbon atoms, a substituted or unsubstituted cycloalkyl group having 3 to 6 carbon atoms, a substituted or unsubstituted aralkyl group having 15 or less carbon atoms and having no hydrogen atom connecting to the α-position carbon atom, a substituted or unsubstituted aryl group having 6 to 15 carbon atoms, or a substituted or unsubstituted alkenyl group having 1 to 6 carbon atoms; $R^2$ is a substituted or unsubstituted alkyl group having 1 to 6 carbon atoms; and a is an integer of 0 to 3.

Examples of the substituent group $R^1$ in the formula (A) include: (i) substituted or unsubstituted alkyl groups, such as, methyl, ethyl, n-propyl, iso-propyl, n-butyl, t-butyl, n-hexyl, n-decyl, trifluoromethyl, 2,2,2-trifluoroethyl, 3,3,3-trifluoropropyl, 3-hydroxy-propyl, 3-glycidoxypropyl, 2-(3,4-epoxycyclohexyl)ethyl, 3-aminopropyl, 3-mercaptopropyl, 3-isocyanatopropyl, and 4-hydroxy-5-(p-hydroxyphenyl carbonyloxy)pentyl; (ii) substituted or unsubstituted cycloalkyl groups, such as, cyclopropyl, cyclobutyl, cyclopentyl, and cyclohexyl; (iii) substituted or unsubstituted aralkyl groups, such as, phenylisopropyl; (iv) substituted or unsubstituted aryl groups, such as, phenyl, tollyl, p-hydroxyphenyl, and naphthyl; and (v) substituted or unsubstituted alkenyl groups, such as, vinyl, allyl, 3-acryloxypropyl, and 3-methacryloxypropyl.

Examples of the substituent group $R^2$ include the substituted or unsubstituted alkyl groups shown above as examples of the substituent group $R^1$. Among them, the substituent group $R^2$ is preferably an unsubstituted alkyl group having 1 to 4 carbon atoms.

Concrete examples of the alkoxysilane compound represented by the above formula (A) include the followings:

(α) tetraalkoxysilane, such as, tetramethoxysilane, tetraethoxysilane, and tetrapropoxysilane;

(β) monoalkyltrialkoxysilane, such as, mono-methyltrimethoxysilane, monomethyltriethoxysilane, monoethyltrimethoxysilane, monoethyltriethoxysilane, monopropyltrimethoxysilane, and monopropyltriethoxy-silane;

(γ) monoaryltrialkoxysilane, such as, monophenyl-trimethoxysilane, monophenyltriethoxysilane, and mono-naphthyltrimethoxysilane;

(δ) trialkoxysilane, such as, trimethoxysilane, tri-ethoxysilane, tripropoxysilane, and tributoxysilane;

(ε) dialkyldialkoxysilane, such as, dimethyldimethoxysilane, dimethyldiethoxysilane, diethyldimethoxysilane, diethyldiethoxysilane, dipropyldimethoxysilane, and dipropyldiethoxysilane;

(ζ) diphenyldialkoxysilane, such as, diphenyldi-methoxysilane, and diphenyldiethoxysilane;

(η) alkylphenyldialkoxysilane, such as, methyl-phenyldimethoxysilane, methylphenyldiethoxysilane, ethylphenyldimethoxysilane, ethylphenyldiethoxysilane, propylphenyldimethoxysilane, and propylphenyldiethoxy-silane; and (θ) trialkylalkoxysilane, such as, trimethyl-methoxysilane, and tri-n-butylethoxysilane.

Among the above, preferred are tetramethoxy-silane, tetraethoxysilane, monomethyltrimethoxysilane, monomethyltriethoxysilane, mononaphthyltrimethoxy-silane, and monophenyltrimethoxysilane.

In the silanol or alkoxysilyl group-containing siloxane resin used in the present invention, the role of functional groups is preferably fulfilled by the silanol groups alone or otherwise by the silanol groups and the alkoxysilyl groups in combination. This means that the siloxane resin can contain unreacted alkoxysilyl groups originated from starting materials. The above silanol or alkoxysilyl group-containing siloxane resin, in which only the silanol groups or otherwise the silanol groups and the alkoxysilyl groups in combination serve as functional groups, can be produced from one or more alkoxysilane compounds represented by the above formula (A). Further, if necessary, the siloxane resin adopted in the present invention can be obtained through hydrolysis-condensation from a mixture of: one or more alkoxysilane compounds of the formula (A) in which neither $R^1$ nor $R^2$ is a reactive group such as hydroxyl group, and one or more alkoxysilane compounds of the formula (A) in which $R^1$ and/or $R^2$ is a reactive group such as hydroxyl group. As a starting material for producing the siloxane resin in the present invention, it is preferred to use an alkoxysilane compound of the formula (A) in which the number a is 0 or 1. In addition, if necessary, another alkoxysilane compound of the formula (A) in which the number a is 2 or 3 can be further used in combination.

Another typical example of the siloxane resin usable in the present invention can be obtained, for example, by hydrolysis of one or more halosilane compounds represented by the following formula (B) in an organic solvent:

$$(R^1)_a SiX_{4-a} \quad (B).$$

In the above formula, $R^1$ and a are the same as those described above, and X is a halogen atom.

Examples of $R^1$ and a in the formula (B) are preferably the same as those described above for the formula (A). Examples of X include chlorine atom, bromine atom, and iodine atom.

From the above halosilane compound, a silanol group-containing siloxane resin can be produced in the same manner as when produced from the alkoxysilane compound of the formula (A). Specifically, for example, in the case of trichlorosilane compounds, some chloro-silyl groups undergo hydrolysis-condensation to form Si—O—Si bonds and the other chlorosilyl groups are hydrolyzed to be silanol groups. The content of the silanol groups in the resultant siloxane resin can be controlled by selecting the kind and amount of the adopted halosilane compound, the reaction conditions, and the like. If the halosilane compounds are alone adopted as the starting materials, all the reactive groups are silanol groups in the formed silanol group-containing siloxane resin.

The siloxane resin also can be produced from a combination of the compounds represented by the formulas (A) and (B).

The hydrolysis-condensation reaction of the silane compound for producing the siloxane resin is normally carried out in an organic solvent. There are no particular restrictions on the solvent of alkoxysilane solution as long as it can dissolve or disperse the formed resin. The solvent can be properly selected from known organic solvents. Examples of the organic solvent include: monovalent alcohols, such as, methyl alcohol, ethyl alcohol, propyl alcohol, butyl alcohol, isobutyl alcohol, and isoamyl alcohol; multivalent alcohols, such as, ethylene glycol, diethylene glycol, propylene glycol, glycerine, trimethylolpropane, and hexanetriol; mono-ethers or acetates of multivalent alcohols, such as, ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, propylene glycol monomethyl ether, propylene glycol monoethyl ether, propylene glycol monopropyl ether, propylene glycol monobutyl ether, and 3-methyl-3-methoxybutanol; esters, such as, methyl acetate, ethyl acetate, and butyl acetate; ketones, such as, acetone, methyl ethyl ketone, and methyl isoamyl ketone; and multivalent alcohol ethers obtained by alkyl-etherizing all hydroxyl groups of multivalent alcohols, such as, ethylene glycol dimethyl ether, ethylene glycol diethyl ether, ethylene glycol dipropyl ether, ethylene glycol dibutyl ether, propylene glycol dimethyl ether, propylene glycol diethyl ether, propylene glycol dibutyl ether, diethylene glycol dimethyl ether, diethylene glycol methyl ethyl ether, and diethylene glycol diethyl ether. The solvent used for the reaction of the alkoxysilane compound is usually also used as a solvent of the photosensitive composition, which is successively applied on a substrate.

The molecular weight of the siloxane resin is properly selected according to, for example, the concentration of the composition and the content of functional groups in the resin. However, in order to reduce scum remaining after development of the coating containing the photosensitive composition and also to improve the sensitivity, the resin preferably has a small molecular weight. Specifically, if the photosensitive composition serves as a positive-working composition, the resin having a small molecular weight increases the solubility of the coating in the exposed area and consequently improves the sensitivity of the photo-sensitive composition. On the other hand, if the photo-sensitive composition serves as a negative-working composition, the sensitivity increases in accordance with increase of the solubility of the coating in the unexposed area. Accordingly, also in that case, the resin having a small molecular weight improves the sensitivity and hence is preferred. However, the molecular weight should be not too small to keep the pattern shape good after the curing procedure. In view of those, the siloxane resin has a weight average molecular weight (Mw) of preferably 400 to 5000, more preferably 600 to 3000. Here, the "weight average molecular weight" means a polystyrene-reduced weight average molecular weight determined by gel permission chromatography.

(b) crown Ether

The photosensitive composition according to the present invention is partially characterized by comprising a crown ether. There are various known crown ethers, and any of them can be selected according to the aimed use in the present invention. However, in the present invention, preferred are crown ethers consisting of only the atoms of carbon, hydrogen and oxygen. If containing other atoms, the crown ether can impair the effect of the present invention. This should be paid attention to. Further, it is particularly preferred for the crown ether to contain neither an amino group nor a tertiary ammonium group. If the composition comprises a crown ether containing the above group, the crown ether functions as a catalyst promoting the polymerization reaction of the silanol group-containing siloxane resin, and, as a result, the photosensitive composition tends to experience an increase in viscosity. This also should be paid attention to. In addition, although the problem of increasing the viscosity is hardly caused by nitrogen-containing groups other than the amino group or the tertiary ammonium group, they often color the resultant coating. Accordingly, in the case where the composition comprises a crown ether containing a nitrogen-containing group, it is necessary to be careful about that. Specifically, for example, even if containing an azo, diazo or oxime group, the crown ether colors the coating in such a small degree as to cause no practical problem. On the other hand, however, if containing an amido, imino, imido or urea group, the crown ether colors the coating in such a considerable degree that it is preferred to avoid adopting the crown ether for applications in which the transparency of the coating is regarded as important.

The crown ether usable in the present invention can have a substituent group, such as, a hydroxyl, carboxy or aromatic group. However, if the crown ether ring is condensed with an aromatic ring having a hydrogen atom at the α-position, the coating tends to be colored after the curing procedure. It is hence necessary to pay attention to that.

Crown ethers having the simplest structures are generally represented by the formula: (—$CH_2$—$CH_2$—O—)$_n$. Among them, crown ethers of n=4 to 7 are preferably used in the present invention. Some crown ethers are often referred to as "x-crown-y-ethers", in which x stands for the number of atoms constituting the ring and y stands for the number of oxygen atoms included in the ring. In the present invention, the crown ether is preferably selected from the group consisting of x-crown-y-ethers where x and y satisfy the condition of x=12, 15, 18 or 21 and y=x/3, benzo-condensed compounds thereof, and cyclohexyl-condensed compounds thereof. Particularly preferred examples of the crown ether include: 21-crown-7-ether, 18-crown-6-ether, 15-crown-5-ether, 12-crown-4-ether, dibenzo-21-crown-7-ether, dibenzo-18-crown-6-ether, dibenzo-15-crown-5-ether, dibenzo-12-crown-4-ether, dicyclo-hexyl-21-crown-7-ether, dicyclohexyl-18-crown-6-ether, dicyclohexyl-15-crown-5-ether, and dicyclohexyl-12-crown-4-ether. From those, 18-crown-6-ether and 15-crown-5-ether are most preferably selected. There are some commercially available crown ethers containing impurities. However, if the composition comprises a crown ether containing impurities, in particular, alkali metals, the effect of the present invention often cannot be sufficiently obtained. It is hence necessary to pay attention to that. The allowable amount of metal impurities in the present invention depends on the aimed use of the composition and on the required semiconductor device, and hence is not exclusively determined. Nevertheless, the content of impurities is preferably below the level generally allowed in the field of semiconductor applications.

(c) Photosensitive Material

The composition according to the present invention comprises a photosensitive material. Depending on the photosensitive material, the siloxane resin composition of the present invention functions as either a positive- or negative-working photosensitive composition.

(c1) Positive-Working Photosensitive Material

If the photosensitive material has an effect on the siloxane resin composition of the present invention to make it developable so that the composition spread in an exposed area can be soluble in an alkali developer, the composition serves as a positive-working photo-sensitive composition. Preferred examples of the photosensitive material having the above effect include diazonaphthoquinone derivatives, which are esters of phenolic hydroxyl-containing compounds with naphtha-quinonediazidesulfonic acids. There are no particular restrictions on the structure of the diazonaphtoquinone derivative, but the derivative is preferably an ester compound derived from a compound having one or more phenolic hydroxyl groups. Examples of the naphtha-quinonediazidesulfonic acids include 4-naphthoquinone-diazidesulfonic acid and 5-naphthoquinonediazidesulfonic acid. Since having an absorption band in the wave-length range of i-line light (wavelength: 365 nm), the 4-naphthoquinonediazidesulfonic ester compound is suitable for i-line light exposure. On the other hand, since having an absorption band in a wide wavelength range, the 5-naphthoquinonediazidesulfonic ester compound is suitable for exposure in a wide wavelength range. Accordingly, it is preferred to select 4- or 5-naphthoquinonediazidesulfonic ester compound according to the wavelength for exposure. It is also possible to use both of them in combination.

There are no particular restrictions on the phenolic hydroxyl-containing compound. Examples thereof are shown as follows (in which all the compound names except "bisphenol A" are trade names [trademark] manufactured by HONSHU CHEMICAL INDUSTRY CO., LTD.).

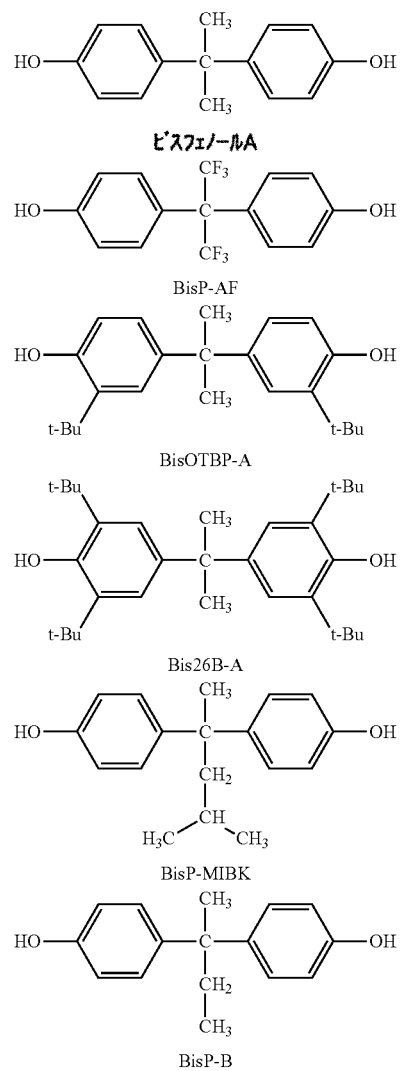

-continued
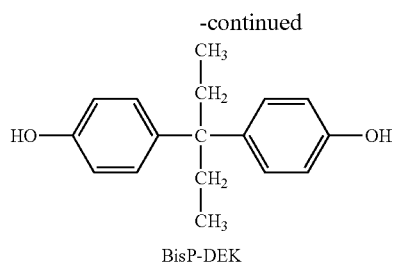
BisP-DEK
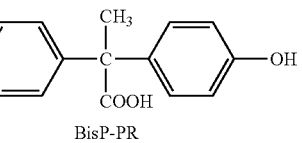
BisP-PR
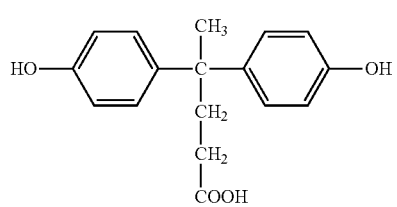
BisP-LV
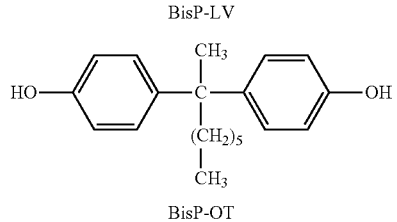
BisP-OT
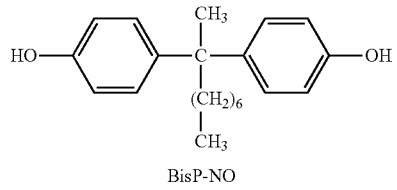
BisP-NO
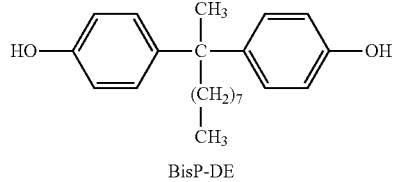
BisP-DE
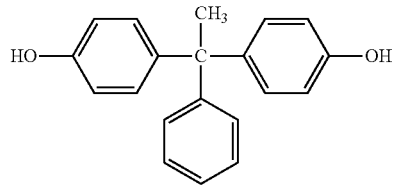
BisP-AP
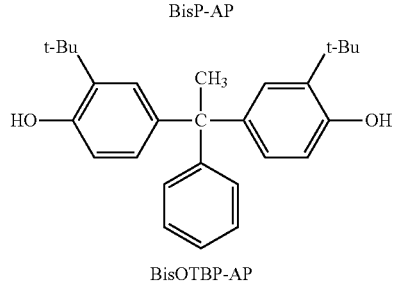
BisOTBP-AP
-continued
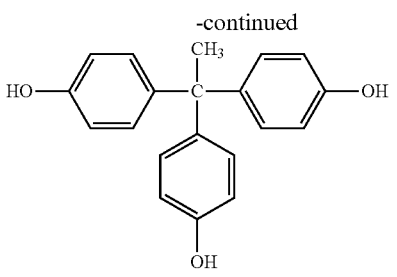
TrisP-HAP
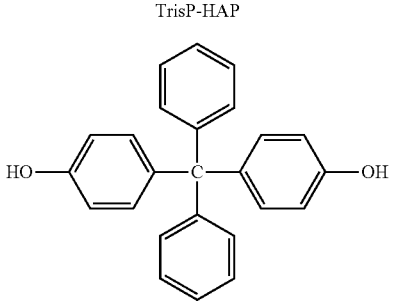
BisP-DP
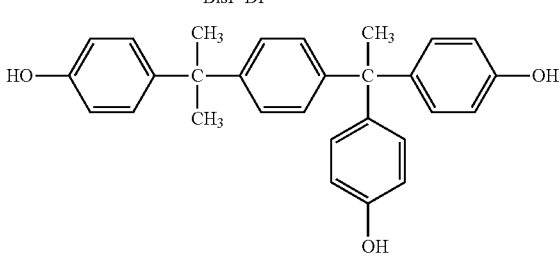
TrisP-PA
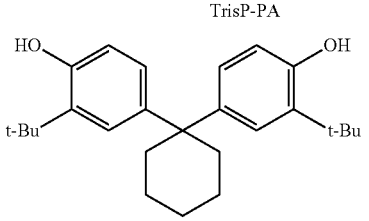
BisOTBP-Z
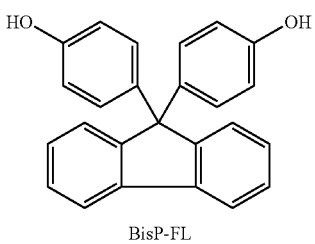
BisP-FL
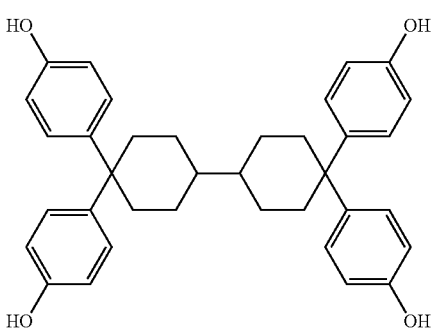
TekP-4HBP

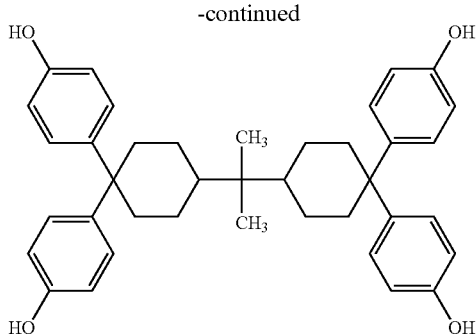

TekP-4HBPA

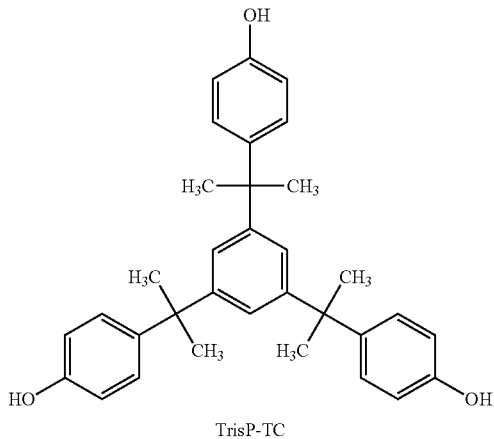

TrisP-TC (c2) Negative-Working Photosensitive Material

If made to be developable by the effect of the photosensitive material so that the composition spread in an exposed area is insoluble in an alkali developer, the photosensitive composition of the present invention serves as a negative-working composition. Preferred examples of the photosensitive material having the above effect include photo-acid generators, photo-base generators, and photo-polymerization initiators.

The photo-acid generator can be freely and properly selected from known photo-acid generators used in conventional chemically amplified resists. Examples of the photo-acid generator include naphthoquinonediazide compounds and onium salts. Examples of the naphthoquinonediazide compounds include the above esters of phenolic hydroxyl-containing compounds with 4-naphthoquinonediazidesulfonic acid.

In the present invention, the photo-acid generator can be used singly or in combination of two or more compounds.

The onium salt serving as a photo-acid generator is, for example, an iodonium salt, a sulfonium salt or a phosphonium salt. Preferred examples of the onium salt include diphenyliodonium triflate, diphenyliodonium pyrenesulfonate, triphenylsulfonium triflate, and tri-phenylsulfonium naphthalenesulfonate.

Examples of the photo-base generator preferably used in the present invention include orthonitrobenzyl carbamates and α,α-dimethyl-3,5-dimethoxybenzyl carbamates.

Examples of the orthonitrobenzyl carbamates include [[(2-nitrobenzyl)oxy]carbonyl]methylamine, [[(2-nitrobenzyl)oxy]carbonyl]propyl-amine, [[(2-nitro-benzyl)oxy]carbonyl]hexylamine, [[(2-nitrobenzyl)oxy]-carbonyl]cyclohexylamine, [[(2-nitrobenzyl)oxy]carbonyl]hexylamine, [[(2-nitrobenzyl)oxy]carbonyl]piperidine, bis [[(2-nitrobenzyl)oxy]carbonyl]hexamethylene-diamine, bis [[(2-nitrobenzyl)oxy]carbonyl]phenylenediamine, bis[[(2-nitrobenzyl)oxy]carbonyl]toluenediamine, bis[[(2-nitrobenzyl)oxy]carbonyl]diaminodiphenylmethane, [[(2,6-dinitrobenzyl)oxy]-carbonyl]methylamine, [[(2,6-dinitrobenzyl)oxy]-carbonyl]propylamine, [[(2,6-dinitrobenzyl)oxy]carbonyl]butylamine, [[(2,6-dinitrobenzyl)oxy]carbonyl]hexylamine, [[(2,6-dinitrobenzyl)oxy]carbonyl]aniline, bis[[(2,6-dinitrobenzyl) oxy]-carbonyl]ethylenediamine, bis[[(2,6-dinitrobenzyl) oxy]-carbonyl]hexamethylenediamine, and bis[[(2,6-dinitrobenzyl) oxy]-carbonyl]phenylenediamine.

Examples of the α,α-dimethyl-3,5-dimethoxybenzyl carbamates include [[(α,α-dimethyl-3,5-di-methoxybenzyl) oxy]carbonyl]methyla mine, [[(α,α-di-methyl-3,5-dimethoxybenzyl)oxy]carbonyl]propyla mine, [[(α,α-dimethyl-3,5-dimethoxybenzyl)oxy]carbonyl]-butylamine, [[(α,α-dimethyl-3,5-dimethoxybenzyl)oxy]-carbonyl]hexylamine, [[(α,α-dimethyl-3,5-dimethoxy-benzyl)oxy]carbonyl]cyclohexyla mine, [[(α,α-di-methyl-3,5-dimethoxybenzyl)oxy]carbonyl]aniline, [[(α,α-dimethyl-3,5-dimethoxybenzyl)oxy]carbonyl]-piperidine, bis[[(α,α-dimethyl-3,5-dimethoxybenzyl)-oxy]carbonyl] ethylenediamine, bis[[(α,α-dimethyl-3,5-dimethoxybenzyl) oxy]carbonyl]hexamethylenediamine, and bis[[(α,α-dimethyl-3,5-dimethoxybenzyl)oxy]-carbonyl] phenylenedia mine.

In the present invention, any conventionally known photo-polymerization initiator can be employed. Examples of the photo-polymerization initiator include 2,2-dimethoxy-1,2-diphenylethane-1-one, 1-hydroxy-cyclohexyl-phenyl-ketone, 2-hydroxy-2-methyl-1-phenyl-propane-1-one, bis(2,4,6-trimethylbenzoyl)-phenylphosphine oxide, 2-benzyl-2-dimethyla mine, 2-methyl-1-(4-methylthiophenyl)-2-morpholino-propane-1-one, and 2-(benzoyloxyimino)-1-[4-(phenyl-thio)phenyl]-1-octanone. Those photo-polymerization initiators are commercially available, for example, from BASF Japan Ltd. (IRGACURE ([trademark]). They can be used singly or in combination of two or more.

(d) Solvent

The composition according to the present invention comprises an organic solvent for dissolving or dispersing the siloxane resin, the crown ether, the photosensitive material, and, if necessary, additives. It is possible to adopt a solvent used in the hydrolysis-condensation reaction of alkoxysilane compound directly as the organic solvent of the photosensitive composition, and other solvents can be further mixed therein. Otherwise, after isolated and separated from the reaction solvent, the produced siloxane resin containing no solvent can be dissolved or dispersed in a new solvent to prepare the composition. Specifically, the above-described known solvents are usable, but ether esters such as propylene glycol monomethyl ether acetate (hereinafter, often referred to as "PGMEA") are generally employed and hence preferred in the field of semiconductor or liquid crystal applications. Other preferred examples of the solvent include 3-methyl-3-methoxybutanol, and 3-methyl-3-methoxybutyl acetate.

(e) Other Additives

The photosensitive composition of the present invention can contain other additives according to necessity. Examples of the usable additives include surfactants, hardening agents, thickening agents, smoothing agents, and quenchers. The surfactants are incorporated so as to improve the composition in coatability and wettability on the substrate. There are many known surfactants, such as, anionic surfactants, cationic surfactants, nonionic surfactants, and amphoteric surfactants.

Among them, nonionic surfactants are preferred because they have fewer polar groups, which can lower the storage stability of the composition.

Examples of the nonionic surfactants usable in the present invention include: polyoxyethylene alkyl ethers, such as, polyoxyethylene lauryl ether, polyoxyethylene oleyl ether, and polyoxyethylene cetyl ether; polyoxy-ethylene fatty acid diesters; polyoxy fatty acid mono-esters; polyoxyethylene polyoxypropylene block-polymers; acetylene alcohols; acetylene glycols; poly-ethoxylates of acetylene alcohols; acetylene glycol derivatives, such as, polyethoxylate of acetylene glycol;

fluorine-containing surfactants, such as, Fluorad ([trademark], manufactured by Sumitomo 3M Limited), MEGA-FAC ([trademark], manufactured by DIC Corporation), and Surufuron ([trademark], manufactured by Asahi Glass Co., Ltd.); and organic siloxane surfactants, such as, KP341 ([trademark], manufactured by Shin-Etsu Chemical Co., Ltd.). Examples of the above acetylene glycols include: 3-methyl-1-butyne-3-ol, 3-methyl-1-pentyne-3-01, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, and 2,5-dimethyl-2,5-hexanediol.

In the case where the composition of the present invention serves as a negative-working photosensitive composition, it is preferred to incorporate a quencher into the composition so as to prevent an acid or a base from diffusing into the unexposed area and thereby to ensure an accurate pattern width. If the photo-acid generator is adopted, the quencher is, for example, a nitrogen-containing organic compound. On the other hand, if the photo-base generator is adopted, the quencher is, for example, a sulfonium compound or a carboxy group-containing compound.

Examples of the nitrogen-containing organic compound include heterocyclic aromatic compounds, aliphatic amines, amides, and amino acids. Preferred are heterocyclic aromatic compounds, and particularly preferred are pyridine, pyrrole, imidazole and derivatives thereof.

The sulfonium compound is, for example, represented by the following formula:

$R^a R^b R^c S^+ OH^-$ in which each of $R^a$, $R^b$ and $R^c$ is independently an alkyl group, a substituted or unsubstituted cycloalkyl group, or a substituted or unsubstituted aryl group.

Examples of the carboxy group-containing compound include aliphatic carboxylic acids and amino acids. Preferred are acetic acid, propionic acid, linoleic acid, 4-aminobenzoic acid, and derivatives thereof.

The nitrogen-containing compound, the sulfonium compound and the carboxy group-containing compound can be properly used in combination.

As described above, the photosensitive siloxane resin composition of the present invention realizes both high sensitivity and excellent resistance to thermal reflow processing, and is also excellent in storage stability.

There are no particular restrictions on the amount of the siloxane resin contained in the photosensitive composition of the present invention. The content of the siloxane resin is properly controlled according to the kind of the resin and to the aimed use of the composition. However, in order to obtain a coating of sufficient thickness, the siloxane resin is preferably contained in a large amount. On the other hand, in view of the temporal stability of the photosensitive composition, the content is preferably less than a particular amount. Accordingly, the photosensitive composition contains the siloxane resin in an amount of preferably 1 to 60 wt %, more preferably 5 to 50 wt %, based on the total weight of the composition including the solvent described later.

The photosensitive composition of the present invention contains the crown ether in an amount of preferably 0.1 to 20 wt %, more preferably 0.5 to 10 wt %, based on the total weight of the composition. If the amount is less than 0.1 wt %, the crown ether often cannot have an effect enough to improve the solubility in the alkali developer. On the other hand, however, if the amount is more than 20 wt %, the pattern formed from the composition of the present invention tends to come off easily from the substrate in the course of development and/or rinse procedure.

In the case where the composition of the present invention contains a diazonaphtoquinone derivative as the photosensitive material and thereby functions as a positive-working photosensitive composition, the content thereof is preferably 3 to 20 wt %, more preferably 5 to 15 wt %, based on the total weight of the siloxane resin although the optimum content depends on the esterifying ratio of the naphthoquinonediazidesulfonate, on the properties of the used polysiloxane, on the required sensitivity, and on the dissolution contrast between the exposed and unexposed areas. If contained in an amount of less than 3 wt %, the diazonaphthoquinone derivative often causes such low dissolution contrast between the exposed and unexposed areas that the composition cannot have practical photo-sensitivity. In order to realize favorable dissolution contrast, the content is preferably 8 wt % or more. On the other hand, however, if the diazonaphthoquinone derivative is added in an amount of more than 20 wt %, the compatibility between the polysiloxane and the quinonediazide compound can be lowered to cloud or whiten the formed coating and/or the quinonediazide compound can decompose in the thermal curing to color the hardened film remarkably and hence to lower the colorless transparency of the film. Further, if contained too much, the diazonaphtoquinone derivative often thermally decomposes to cause troubles in the post-process, for example, to deteriorate the electric insulation of the hardened film and/or to release gases. That is because the diazonaphthoquinone derivative has heat-resistance lower than the polysiloxane. In addition, it is also feared that the resultant hardened film can have low resistance against a photoresist stripper containing, for example, monoethanol amine as a main agent. The photo-diazonaphthoquinone derivative can be used singly or in combination of two or more derivatives.

The content of the photo-acid generator, the photo-base generator or the photo-polymerization initiator is properly controlled according to necessity, but is normally 0.1 to 20 wt %, preferably 0.5 to 10 wt %, based on the total weight of the siloxane resin. If containing the above photosensitive material in an amount of 0.1 wt % or more, the composition enables to form a pattern sufficiently. On the other hand, if containing the photosensitive material in an amount of 20 wt % or less, the composition can be in the form of homogeneous solution and hence can be improved in storage stability. The photosensitive material can be singly used or in combination of two or more.

The photosensitive composition according to the present invention can contain the surfactant in an amount of preferably 50 to 100000 ppm, more preferably 100 to 50000 ppm, based on the total weight of the composition. If the amount is too small, the composition cannot obtain surface activity enough to improve the wettability. On the other hand, however, if containing the surfactant too much, the composition often foams insomuch that bubbles can be generated in the coating machine and hence that the treatability can be lowered. Accordingly, this should be paid attention to.

In the photosensitive composition of the present invention, the content of the solvent is unequivocally determined depending on the contents of the above components, but is controlled according to, for example, the viscosity of the composition and the thickness of the formed coating. If the content is too small, it is often difficult to form a coating of sufficient thickness. On the other hand, if the content is too large, the composition tends to deteriorate in temporal stability. This also should be paid attention to.

In the photosensitive composition according to the present invention, all the components preferably have high purities. As for the crown ether, the content of metal impurities is preferably as small as described above. Also as for other components, it is generally preferred to adopt substances purified enough to use for electronic applications such as semiconductor devices and liquid crystal devices. It is natural to adopt those purified substances when the composition of the present invention is used for electronic applications such as semiconductor devices and liquid crystal devices. Even so, however, if containing a large amount of metal impurities, the composition is often insufficiently improved in sensitivity. This still also should be paid attention to. In the present invention, the content of impurities is preferably below the level generally allowed in the field of electronic applications such as semi-conductor devices and liquid crystal devices.

Patten Formation Method

The photosensitive composition according to the present invention can realize pattern formation excellent in, for example, reduction of scum. The following will explain a pattern formation method employing the above photosensitive composition.

(a) Coating

First, the above photosensitive composition is cast on a substrate to form a coating. There are no particular restrictions on the substrate, and examples thereof include a silicon substrate, a glass plate, a metal plate and a ceramic plate. However, in the present invention, it is particularly preferred to adopt a substrate required to be coated with an insulating film, such as, a TFT surface of a liquid crystal display. There are also no particular restrictions on the coating method, and it is possible to adopt various methods, such as, spin coating, dip coating, knife coating, roll coating, spray coating, and slit coating.

(b) Prebaking

The coating thus formed on the substrate can be subjected to prebaking, if necessary, so as to remove the organic solvent from the coating. The pre-baking temperature is properly determined according to the kind of the organic solvent contained in the coating. If the temperature is too low, the solvent generally remains insomuch that equipments for conveying the substrate can be damaged. On the other hand, however, if the temperature is too high, the coating is dried so rapidly that the pre-baking procedure can cause problems of forming unevenness of the coating and of sublimating the silanol or alkoxysilyl group-containing siloxane resin. Accordingly, the pre-baking temperature is preferably 60 to 200° C., more preferably 80 to 150° C. The pre-baking procedure can be carried out by means of a heating apparatus, such as, a hot-plate or an oven. The time for prebaking is properly controlled according to the kind and amount of the used solvent and to the pre-baking temperature, but is preferably 30 seconds to 10 minutes, more preferably 1 to 5 minutes.

(c) Exposure

Successively, the coating is imagewise exposed so as to form a desired pattern. The exposure can be carried out in a conventionally known manner, such as, mask exposure or scanning exposure. Light normally used for the exposure is, for example, g-line light, h-line light, i-line light, light in a broad wavelength band including g-, h- and i-lines, KrF excimer laser beams, ArF excimer laser beams, or electron beams.

(d) Treatment with Alkali Aqueous Solution

After the exposure, the coating is subjected to treatment with an alkali aqueous solution for development. There are no particular restrictions on the treatment, and the coating can be treated by a normal method, such as, by immersing (dipping) in the alkali aqueous solution or by subjecting to paddle, shower, slit, cap-coat or spray development.

The alkali aqueous solution can contain any alkaline compound. However, it is preferred to use an organic alkaline compound. Examples of the organic alkaline compound include: tertiary ammonium compounds, aminoalcohols (alkanol amines), aqueous ammonia, alkyl amines, and heterocyclic amines. Preferred examples of the tertiary ammonium compounds include: tetramethylammonium hydroxide (hereinafter, often referred to as "TMAH"), tetraethyl-ammonium hydroxide, tetrapropylammonium hydroxide, trimethylethylammonium hydroxide, trimethyl-(2-hydroxyethyl)ammonium hydroxide (choline), tri-ethyl(2-hydroxyethyl)ammonium hydroxide, tripropyl-(2-hydroxyethyl)ammonium hydroxide, and trimethyl-(2-hydroxypropyl)ammonium hydroxide. Among them, particularly preferred is TMAH.

The aqueous solution containing an inorganic alkaline compound can be used without any problem for applications not concerned with electric properties or semiconductor properties, such as, for production of hard coat films. However, since the inorganic alkali aqueous solution contains metal ions such as sodium and potassium ions, it is not preferred to adopt the inorganic alkali solution for applications in which account must be taken of electric properties or semiconductor properties, for example, for production of interlayer dielectric films or flattening films in TFTs.

In the present invention, the concentration of the alkali aqueous solution for the treatment depends on various factors, such as, the kind and content of the used alkali, the kind of the silanol or alkoxysilyl group-containing siloxane resin to be treated, and the thickness of the coating, and hence is not particularly restricted. The higher the alkali concentration range is, the larger effect the crown ether tends to have. However, in view of the concentration of alkali aqueous solution generally used in the field of electronic materials, the alkali concentration range of the aqueous solution is generally 1 to 5%, preferably 1.5 to 3%.

The time for the treatment with the alkali aqueous solution is preferably about 15 seconds to 3 minutes in general. The time is preferably short in view of the production efficiency, but is preferably long enough to reduce variations of the development results. The development can be carried out at room temperature.

(e) Rinse Treatment

Successively after the development, the coating can be subjected to rinse treatment, which is carried out so that the alkali aqueous solution and residues remaining on the surface of the developed coating can be washed away with water. Accordingly, any rinsing method can be used as long as it can wash away the alkali aqueous solution and the like from the coating surface. For example, the coating can be immersed in water, can be exposed to water flow, or can be showered with water. Those conventionally known rinsing methods can be properly selected to use. The time for rinse treatment is not particularly restricted as long as the alkali solution can be removed from the coating surface. For example, the time for immersion rinse and for rinse with flowing water can be about 30 seconds to 5 minutes and 15 seconds to 3 minutes, respectively. For applications in which account must be taken of electric properties or semiconductor properties, the rinse treatment is preferably carried out with deionized or pure water. Further, in the immersion rinse treatment, the coating can be twice or more immersed in different baths.

(f) Curing (Hardening) Treatment

The curing temperature for hardening the coating can be freely selected as long as the coating can be hardened. However, if the temperature is too low, the reaction cannot proceed enough to harden the coating sufficiently. The temperature is therefore preferably 150° C. or more. Nevertheless, if containing a hardening agent as an additive, the coating can be sufficiently hardened even at a temperature of about 150° C. If OH-groups are left, the resultant film tends to have a high dielectric constant because of polarity of the OH-groups. Accordingly, in the case where the resultant siliceous film is required to have a low dielectric constant, it is preferred to harden the coating at a high temperature, such as, at 200° C. or more. On the other hand, however, if the curing temperature is too high, the cost of thermal energy increases. That is hence not preferred. The curing temperature is therefore preferably 450° C. or less, more preferably 350° C. or less. The curing time is not particularly restricted but preferably 15 minutes to 3 hours. If the curing time is too long, the resultant film is liable to suffer from cracks. That should be paid attention to. The curing procedure is normally carried out in air, but can be performed in an inert gas atmosphere, such as, a nitrogen, helium or argon atmosphere, if necessary. There are also no particular restriction on the heating means, and hence, a hot-plate or an oven, for example, can be used.

The film thus produced experiences formation of scum in a small amount after the development, and also keeps excellent properties, such as, high transparency, high insulativity and low dielectricity, which are characteristics of a coating formed from siloxane resin.

The present invention will be further explained concretely by use of the following examples and comparative examples. However, those examples and comparative examples by no means restrict the present invention.

PRODUCTION EXAMPLE 1

Production of Siloxane Resin Solution X

In 200 g of 3-methyl-3-methoxybutanol, 47.6 g (0.35 mol) of methyltrimethoxysilane, 29.7 g (0.15 mol) of phenyltrimethoxysilane and 4.83 g (0.015 mol) of 3,3',4,4'-benzophenonetetracarboxylic dianhydride were dissolved. While the solution was stirred at 30° C., 34.2 g of distilled water was added therein. The solution was then kept stirred and heated for 1 hour to conduct hydrolysis-condensation. Subsequently, the solution was washed five times with water, and the ethyl acetate oil layer was collected. The ethyl acetate oil layer was concentrated and then the ethyl acetate was replaced with PGMEA, to obtain a 40% solution of methyl-phenyl silsesquioxane condensation polymer.

The obtained siloxane resin was a methyl-phenyl silsesquioxane (methyl:phenyl=7:3 by molar ratio) having a weight average molecular weight (Mw) of 1250.

PRODUCTION EXAMPLE 2

Production of Siloxane Resin Solution Y

In 200 g of 3-methyl-3-methoxybutanol, 47.6 g (0.35 mol) of methyltrimethoxysilane, 29.7 g (0.15 mol) of phenyltrimethoxysilane and 4.83 g (0.015 mol) of 3,3',4,4'-benzophenonetetracarboxylic dianhydride were dissolved. While the solution was stirred at 40° C., 34.2 g of distilled water was added therein. The solution was then kept stirred and heated for 1 hour to conduct hydrolysis-condensation. Subsequently, the solution was washed five times with water, and the ethyl acetate oil layer was collected. The ethyl acetate oil layer was concentrated and then the ethyl acetate was replaced with PGMEA, to obtain a 40% solution of methyl-phenyl silsesquioxane condensation polymer.

The obtained siloxane resin was a methyl-phenyl silsesquioxane (methyl:phenyl=7:3 by molar ratio) having a weight average molecular weight (Mw) of 1500.

Here, the weight average molecular weight (Mw) was determined according to gel-permission chromato-graphic measurement based on monodispersed poly-styrene standard by means of HPLC (GPC system) manufactured by Shimadzu Corporation and two GPC columns (Super Multipore HZ-N [trademark], manufactured by TOSOH CORPORATION) under the conditions of flow: 0.7 mL/minute, eluting solvent: tetrahydrofuran, and column temperature: 40° C.

EXAMPLE 1

To 67.63 g of the siloxane resin solution X produced in Production example 1, 0.14 g of a surfactant KF-54 ([trademark], manufactured by Shin-Etsu Chemical Co., Ltd.), 0.14 g of a naphthoquinone photo-sensitive material P represented by the following formula:

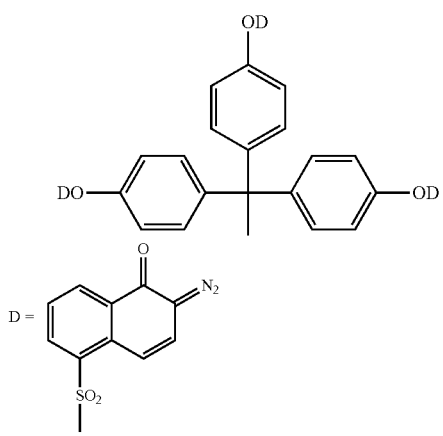

and 29.43 g of PGMEA as a solvent were added and dissolved with stirring to obtain a 30% solution. The obtained solution was filtrated through a 47 mmφ filter (filtration accuracy: 0.1 µm; PTFE [trademark], manufactured by Advantec Toyo Kaisha Ltd.) under a pressure increased by 0.05 MPa, and then collected in a clean polyethylene container (AC100-H [trademark], manufactured by AICELLO CHEMICAL CO., Ltd.) to prepare a photosensitive siloxane composition.

EXAMPLES 2 TO 6 AND COMPARATIVE EXAMPLES 1 to 3

The procedure of Example 1 was repeated except for changing the components into those shown in Table 1, to prepare photosensitive compositions. In Comparative example 3, nitrobenzyl cyclohexylcarbamate was added as a hardening agent.

Each photosensitive composition was spin-coated on a silicon wafer, and then prebaked on a hot-plate at 100° C. to form a coating of 2 pm thickness. After prebaked, the coating was subjected to exposure at 150 mJ/cm² by means of g- and h-lines exposure machine (FX-604 stepper (NA=0.1) [trademark], manufactured by Nikon Corporation), and thereafter immersed to develop in a 2.38% TMAH aqueous solution and then rinsed with pure water, to obtain a 10 pm line-and-space (L/S) pattern and a contact hole (C/H) pattern.

Evaluation on Scum

The surfaces of the developed patterns were observed with a 100-power optical microscope (manufactured by OLYMPUS CORPORATION).

Evaluations on Resistance to Thermal Reflow Processing and on Sensitivity

Each formed line-and-space pattern was wholly subjected to exposure at 500 mJ/cm² by means of a contact aligner (PLA-501 [trademark], manufactured by Canon Inc.), and then cure-hardened at 250° C. for 1 hour under a nitrogen atmosphere. The cured pattern was cut perpendicularly to the surface, and the section was observed with a thermal field emission scanning electron microscope (JSM-7001F [trademark], manufactured by JEOL Ltd.) to measure the contact angle to the substrate surface and thereby to evaluate the resistance to thermal reflow processing. In the case where the pattern was formed from a positive-working type photosensitive composition, it can be said that the larger the contact angle was, the better the resistance was. Separately, each pattern was wholly subjected to exposure in the same manner as above for evaluation on the resistance to thermal reflow processing except that the exposure dose was changed, so as to determine $E_0$, which was such a dose as to make 1:1 of the L/S ratio of the pattern.

Test for Storage Stability

With respect to the prepared photosensitive compositions, the storage stability was evaluated. Each photosensitive composition was left for 1 month at room temperature, and then the kinematic viscosity was measured. The compositions whose viscosities increased by 5% or more from the initial values were regarded as "poor", and those whose viscosities increased by less than 5% were regarded as "good". The kinematic viscosity was determined by means of an automatic viscometer (VMC-252 [trademark], manufactured by RIGO Co., Ltd.).

Transmittance

The UV-visible absorption spectrum of each obtained hardened film was measured by means of a spectrophotometer (MultiSpec-1500 [trademark], manufactured by Shimadzu Corporation), to obtain a transmittance at 400 nm.

Dielectric Constant

Each photosensitive composition was cast on a silicon wafer according to spin-coating method by means of a spin-coater (MS-A100 [trademark], manufactured by MIKASA CO., LTD.), to form a coating of 0.5 μm dry-thickness. The coating was hardened at 250° C. for 1 hour, and the resultant hardened film was subjected to C-V measurement with a capacitance measuring apparatus (manufactured by Solid State Instruments) according to mercury probe method. From the obtained saturation capacitance, the dielectric constant was estimated.

The results are as set forth in Table 1.

TABLE 1

| | Examples | | | | | | Comparative examples | | |
|---|---|---|---|---|---|---|---|---|---|
| | 1 | 2 | 3 | 4 | 5 | 6 | 1 | 2 | 3 |
| Components | | | | | | | | | |
| siloxane resin solution X | 67.63 g | 67.63 g | — | 67.63 g | 67.63 g | — | 67.63 g | — | 67.63 g |
| siloxane resin solution Y | — | — | 67.63 g | — | — | 67.63 g | — | 67.63 g | — |
| naphthoquinone photosensitive material P | 2.71 g | 2.71 g | 2.71 g | 2.71 g | 2.71 g | 2.71 g | 2.71 g | 2.71 g | 2.71 g |
| surfactant (KF-54) | 0.14 g | 0.14 g | 0.14 g | 0.14 g | 0.14 g | 0.14 g | 0.14 g | 0.14 g | 0.14 g |
| 15-crown-5-ether | 0.10 g | 0.50 g | 5.00 g | — | — | — | — | — | — |
| 18-crown-6-ether | — | — | — | 0.10 g | 0.50 g | 5.00 g | — | — | — |
| hardening agent | — | — | — | — | — | — | — | — | 0.30 g |
| PGMEA | 29.42 g | 29.02 g | 24.52 g | 29.42 g | 29.02 g | 24.52 g | 29.52 g | 29.52 g | 29.22 g |
| Evaluation | | | | | | | | | |
| sensitivity (Eo) | 200 | 150 | 150 | 250 | 200 | 200 | 300 | 500 | 500 |
| resistance to thermal reflow processing (degree) | 45 | 60 | 80 | 45 | 60 | 80 | 15 | 45 | 45 |
| scum | none | none | none | none | none | none | none | observed | observed |
| temporal stability | good | good | good | good | good | good | good | good | poor |
| transmittance (%) | 95% | 95% | 95% | 95% | 95% | 95% | 95% | 95% | 95% |
| dielectric constant | 3.2 | 3.2 | 3.2 | 3.2 | 3.2 | 3.2 | 3.2 | 3.2 | 3.2 |

EXAMPLE 7 AND COMPARATIVE EXAMPLE 4

Irgacure OXE02 ([trademark], manufactured by BASF Japan Ltd.) was adopted as a photosensitive material, to prepare compositions shown in Table 2. The compositions were evaluated in the same manner as those in Example 1. The results were as set forth in Table 2. Those examples were negative-working type photosensitive compositions, and hence it can be said that the larger the contact angle was, the better the resistance to thermal reflow processing was.

TABLE 2

| | Ex. 7 | Com. 4 |
|---|---|---|
| Components | | |
| siloxane resin solution X | 67.63 g | 67.63 g |
| siloxane resin solution Y | — | — |
| Irgacure OXE02 | 1.35 g | 1.35 g |
| surfactant (KF-54) | 0.14 g | 0.14 g |
| 15-crown-5-ether | 0.50 g | — |
| 18-crown-6-ether | — | — |
| hardening agent | — | — |
| PGMEA | 30.38 g | 30.88 g |

TABLE 2-continued

|  | Ex. 7 | Com. 4 |
|---|---|---|
| Evaluation | | |
| sensitivity (Eo) | 150 | 200 |
| resistance to thermal reflow processing (degree) | 60 | 15 |
| scum | none | none |
| temporal stability | good | good |
| transmittance (%) | 98% | 98% |
| dielectric constant | 3.0 | 3.0 |

The invention claimed is:

1. A positive working photosensitive siloxane resin composition comprising
 a siloxane resin having silanol groups or alkoxysilyl groups, wherein said siloxane resin comprises at least one structure selected from the group consisting of a silicone skeleton, a silsesquioxane skeleton and a silica skeleton, wherein the silicone skeleton comprises 10 mole % or less of the total siloxane resin,
 a crown ether, selected from the group consisting of 21-crown-7-ether, 18-crown-6-ether, 15-crown-5-ether, 12-crown-4-ether, dibenzo-21-crown-7-ether, dibenzo-18-crown-6-ether, dibenzo-15-crown-5-ether, dibenzo-12-crown-4-ether, dicyclohexyl-21-crown-7-ether, dicyclohexyl-18-crown-6-ether, dicyclo-hexyl-15-crown-5-ether, and dicyclohexyl-12-crown-4-ether.
 a photosensitive additive chosen from a diazonaphthoquinone derivative where a phenolic hydroxyl-containing compound is combined via an ester bond with a naphthoquinonediazidesulfonic acid and,
 an organic solvent.

2. The photosensitive siloxane resin composition according to claim 1, wherein said siloxane resin has a silsesquioxane structure.

3. The photosensitive siloxane resin composition according to claim 1, wherein said siloxane resin has a weight average molecular weight of 400 to 5000.

4. A pattern formation method comprising the steps of:
 coating a substrate with the photosensitive siloxane resin composition according to claim 1, to form a coating;
 subjecting said coating to imagewise exposure;
 treating the exposed coating with an alkali aqueous solution; and then
 curing the treated coating at 150 to 450° C. in air or in an inert gas atmosphere.

5. A siliceous film produced according to the method of claim 4.

6. The photosensitive siloxane resin composition according to claim 1, where the crown ether is selected from the group consisting of 18-crown-6-ether, and 15-crown-5-ether.

7. The photosensitive siloxane resin composition according to claim 1, where the siloxane resin having silanol groups or alkoxysilyl groups, is obtained by hydrolysis of one or more alkoxysilane compounds represented by formula (A);

$$(R^1)_a Si(OR^2)_{4-a} \quad (A)$$

where $R^1$ is a hydrogen atom, a substituted or unsubstituted alkyl group having 1 to 6 carbon atoms, a substituted or unsubstituted cycloalkyl group having 3 to 6 carbon atoms, a substituted or unsubstituted aralkyl group having 15 or less carbon atoms and having no hydrogen atom connecting to the α-position carbon atom, a substituted or unsubstituted aryl group having 6 to 15 carbon atoms, or a substituted or unsubstituted alkenyl group having 1 to 6 carbon atoms, $R^2$ is a substituted or unsubstituted alkyl group having 1 to 6 carbon atoms; and a is an integer of 0 to 3.

8. The photosensitive siloxane resin composition according to claim 1, where the siloxane resin having silanol groups or alkoxysilyl groups, is obtained by hydrolysis of one or more halosilane compounds represented by the following formula (B);

$$(R^1)_a SiX_{4-a} \quad (B),$$

where $R^1$ is a hydrogen atom, a substituted or unsubstituted alkyl group having 1 to 6 carbon atoms, a substituted or unsubstituted cycloalkyl group having 3 to 6 carbon atoms, a substituted or unsubstituted aralkyl group having 15 or less carbon atoms and having no hydrogen atom connecting to the α-position carbon atom, a substituted or unsubstituted aryl group having 6 to 15 carbon atoms, or a substituted or unsubstituted alkenyl group having 1 to 6 carbon atoms, X, is a halogen atom, and a is an integer of 0 to 3.

9. The photosensitive siloxane resin composition according to claim 1, where the siloxane resin having silanol groups or alkoxysilyl groups, is obtained by hydrolysis of a combination of compound (A) and (B).

10. The photosensitive siloxane resin composition according to claim 1, where the naphthoquinonediazidesulfonic acid is 4-napthoquinonediazidesulfonic acid or 5-napthoquinonediazidesulfonic acid.

11. The photosensitive siloxane resin composition according to claim 1, where the phenolic hydroxyl compounds is selected from the group consisting of the following compounds;

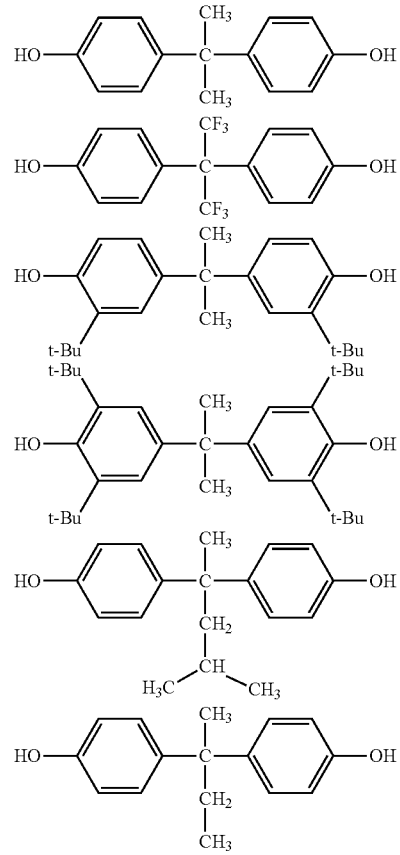

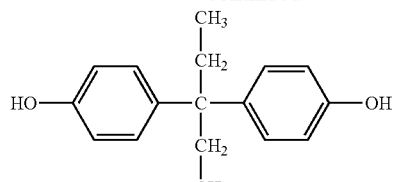
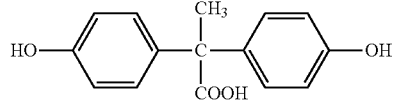
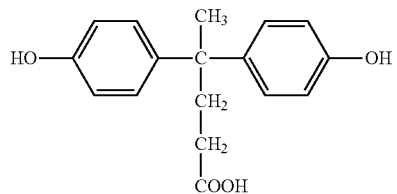
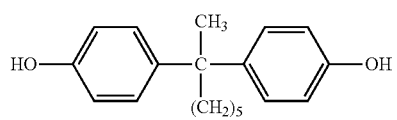
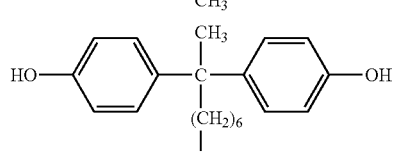
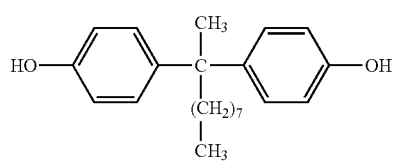
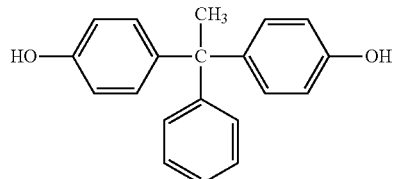
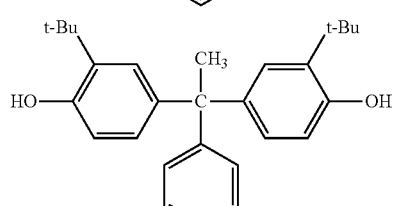
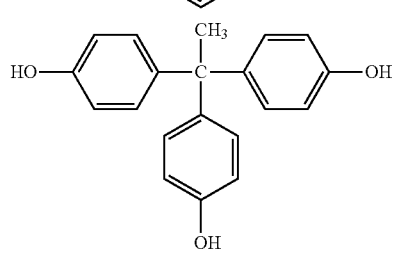
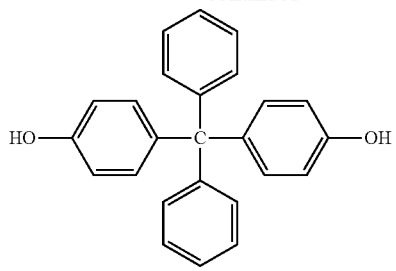
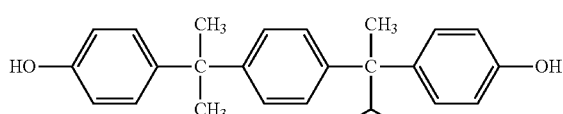
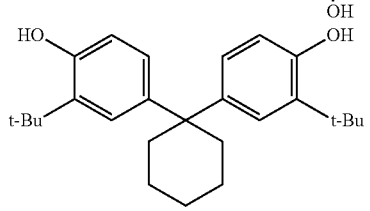
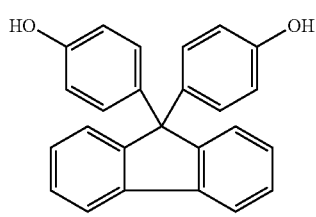
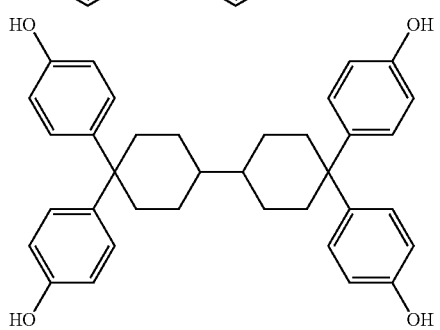
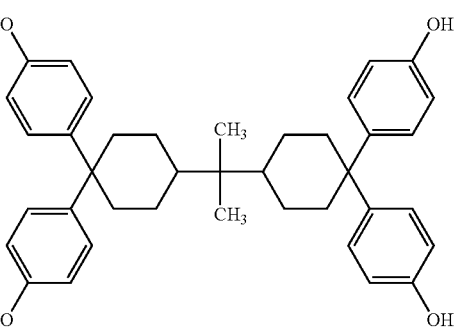
and

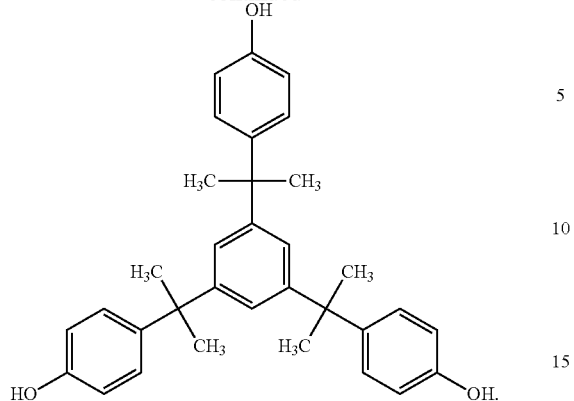
* * * * *